(12) United States Patent
Tarr et al.

(10) Patent No.: US 8,696,417 B2
(45) Date of Patent: Apr. 15, 2014

(54) MODULAR EXHAUST GAS HEADER AND METHOD OF INCORPORATING SAME IN DESIGN LAYOUT FOR A MANUFACTURING PROCESS MACHINE

(75) Inventors: Adam L. Tarr, Colchester, VT (US); Andrew J. Beers, Liberty Hill, TX (US); Joseph E. Mastro, St. George, VT (US)

(73) Assignee: NEHP Inc., Williston, VT (US)

( * ) Notice: Subject to any disclaimer, the term of this patent is extended or adjusted under 35 U.S.C. 154(b) by 1615 days.

(21) Appl. No.: 12/171,695

(22) Filed: Jul. 11, 2008

(65) Prior Publication Data

US 2010/0009615 A1    Jan. 14, 2010

(51) Int. Cl.
*F24F 7/00*    (2006.01)

(52) U.S. Cl.
USPC ............................................................ 454/62

(58) Field of Classification Search
USPC ............ 454/49, 56, 238, 57, 50, 62, 333, 341
See application file for complete search history.

(56) References Cited

U.S. PATENT DOCUMENTS

| | | | |
|---|---|---|---|
| 4,160,407 A * | 7/1979 | Duym | 454/61 |
| 4,208,201 A * | 6/1980 | Rueck | 65/27 |
| 4,753,665 A * | 6/1988 | Fahey | 96/408 |
| 5,291,513 A * | 3/1994 | Pernet et al. | 373/9 |
| 6,309,294 B1 * | 10/2001 | Baumeister et al. | 454/61 |
| 7,039,999 B2 | 5/2006 | Tarr et al. | |
| 7,063,301 B2 | 6/2006 | Schauer | |
| 2004/0020304 A1 * | 2/2004 | Roesler et al. | 73/736 |
| 2005/0039425 A1 * | 2/2005 | Olander et al. | 55/385.2 |
| 2008/0160905 A1 * | 7/2008 | Kim et al. | 454/340 |

FOREIGN PATENT DOCUMENTS

JP    2007029790 A  *  2/2007

OTHER PUBLICATIONS

"Rapid Tool Installation: a process for all concerned," by Kandi Collier, Don Yeamen, Nick De Vries, Arnold Canales, and Dr. Allan Chasey. Semiconductor Fabtech—29th Edition, Mar. 2006, pp. 50-56.

* cited by examiner

*Primary Examiner* — Steven B McAllister
*Assistant Examiner* — Brittany E Towns
(74) *Attorney, Agent, or Firm* — Downs Rachlin Martin PLLC

(57) ABSTRACT

A modular exhaust gas header designed for use with a process tool having a plurality of exhaust gas points of connection. Embodiments of the modular exhaust gas header include a plurality of branch ducts, at least one for each point of connection in the process tool. Branch ducts, and primary ducts with which they are fluidly connected, may be made from materials designed to withstand exhaust gases that have a high temperature, are corrosive, and/or include volatile solvents. If desired, flow control devices and pressure monitoring instrumentation that selectively measures pressure may be used in each branch duct. The header local to the processing system may be incorporated in a method of designing a layout for a manufacturing process tool and associated exhaust gas handling systems.

9 Claims, 6 Drawing Sheets

MODULAR EXHAUST GAS HEADER AND METHOD OF INCORPORATING SAME IN DESIGN LAYOUT FOR A MANUFACTURING PROCESS MACHINE

FIELD OF THE INVENTION

The present invention generally relates to the field of exhaust gas handling in manufacturing environments. In particular, the present invention is directed to a modular exhaust gas header and a method of designing a manufacturing facility including a plurality of process machines that emit exhaust gases.

BACKGROUND

The installation of semiconductor fabrication machines or process tools used in the semiconductor fabrication industry involves connecting each process tool and its support equipment to exhaust gas piping or ductwork that carries chemical gases used or generated in the semiconductor fabrication process away from the process tool. Such gases are transported to either an environmental treatment and control device or to a chemical recovery and recycle process. Fabrication of process piping or ductwork in situ on the manufacturing floor can compromise the integrity of the clean room, delay and extend hookup of process tools, and interfere with process qualification. This "site-built" fabrication of exhaust gas piping or ductwork also reduces standardization of maintenance and complicates process troubleshooting.

Process machines, also referred to as systems or tools, may require or generate different types of gases, depending upon the process being conducted. Even when carrying out identical processes, a process tool from one manufacturer may contain a number of exhaust gas points of connection (POC's) that differs from the number of POCs on a process tool from another manufacturer.

The differing nature of exhaust gases emitted from process tools often requires some segregation of exhaust gas handling systems. Some exhaust gases are caustic and corrosive, some are volatile solvents, and others are at high temperature. These different physical and chemical characteristics can impose engineering challenges regarding design of exhaust gas piping or ductwork systems.

SUMMARY OF THE DISCLOSURE

In one embodiment, a method of designing an exhaust gas system for a manufacturing facility having at least one manufacturing process tool with a plurality of exhaust gas points of connection and an exhaust gas handling system is provided. The method includes determining the location of a manufacturing process tool in a manufacturing facility; selecting a modular exhaust gas header built outside the manufacturing facility for use with the manufacturing process tool, the modular exhaust gas header having a plurality of branch ducts, at least one for each of the exhaust gas points of connection in the manufacturing tool, so that each of the exhaust gas points of connection of the process tool may be connected to a corresponding respective one of the plurality of branch ducts, the modular exhaust gas header having a primary duct fluidly connected with the plurality of branch ducts; determining the location of the modular exhaust header with respect to the process tool; and designing any ductwork connections required for connecting the primary duct with the exhaust gas handling system and for connecting the branch ducts with the exhaust gas points of connection.

In another embodiment, a method of installing an exhaust gas system is provided. The system includes designing a modular exhaust gas header for use with a first manufacturing process tool having a plurality of exhaust gas points of connection and intended for installation in a manufacturing clean room, wherein the designing step is performed with respect to the first manufacturing process tool but not with respect to the clean room in which the header will be installed. The method further includes fabricating a modular exhaust gas header in a clean room facility separate from the manufacturing clean room, the header having a plurality of branch ducts, each one of the plurality of branch ducts being designed for attachment to a corresponding one of the plurality of exhaust gas points of connection of the manufacturing process tool; fluidly connecting the modular exhaust gas header to an exhaust gas handling system for the clean room so that exhaust gases present in the header may be transported to the exhaust gas handling system; and connecting the modular exhaust gas header in the manufacturing facility to the manufacturing process tool so that each exhaust gas point of connection is fluidly connected to the header so that exhaust gases emitted from each exhaust gas point of connection may be transported to the modular exhaust gas header.

In yet another embodiment, a modular exhaust gas header that comprises at least one primary exhaust gas duct having a hollow interior for transporting exhaust gases is provided. The header has a plurality of branch ducts having hollow interiors, each connected to said at least one primary exhaust gas ducts so as to fluidly connect said interior said at least one primary exhaust gas duct with the interiors of the plurality of branch ducts; a pressure sensor for measuring pressure in a selected one of the plurality of branch ducts; and a plurality of impulse tubes fluidly coupling the interiors of the plurality of branch ducts with the pressure sensor.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

The present disclosure is directed to a modular exhaust gas header and a method of designing a manufacturing facility utilizing modular exhaust gas headers. The modular exhaust gas header may be used with manufacturing process machines with multiple exhaust gas ports in a way that creates more efficient field installation schedules, reduces process machine hookup times, reduces setup time during process machine qualification, troubleshooting time during process deviations and recovery time during both regular and non-scheduled maintenance events. Installation of exhaust gas headers may occur before process machines arrive on site, which reduces the number of connections that must be made in the field. By increasing standardization of installed equipment, both safety and manufacturing quality control and quality assurance (QC/QA) are improved. The modular exhaust gas headers and method of manufacturing facility design may be used in connection with both new installations and retrofitted or modified production lines. Modular exhaust gas headers also provide a convenient site to monitor exhaust gas pressure and balance pressure or gas flow rates for multiple exhaust gas lines from a given process tool or auxiliary equipment. Use of modular exhaust gas headers will reduce the use of complicated supports and hangers for ductwork under a raised floor system.

Figure 1:
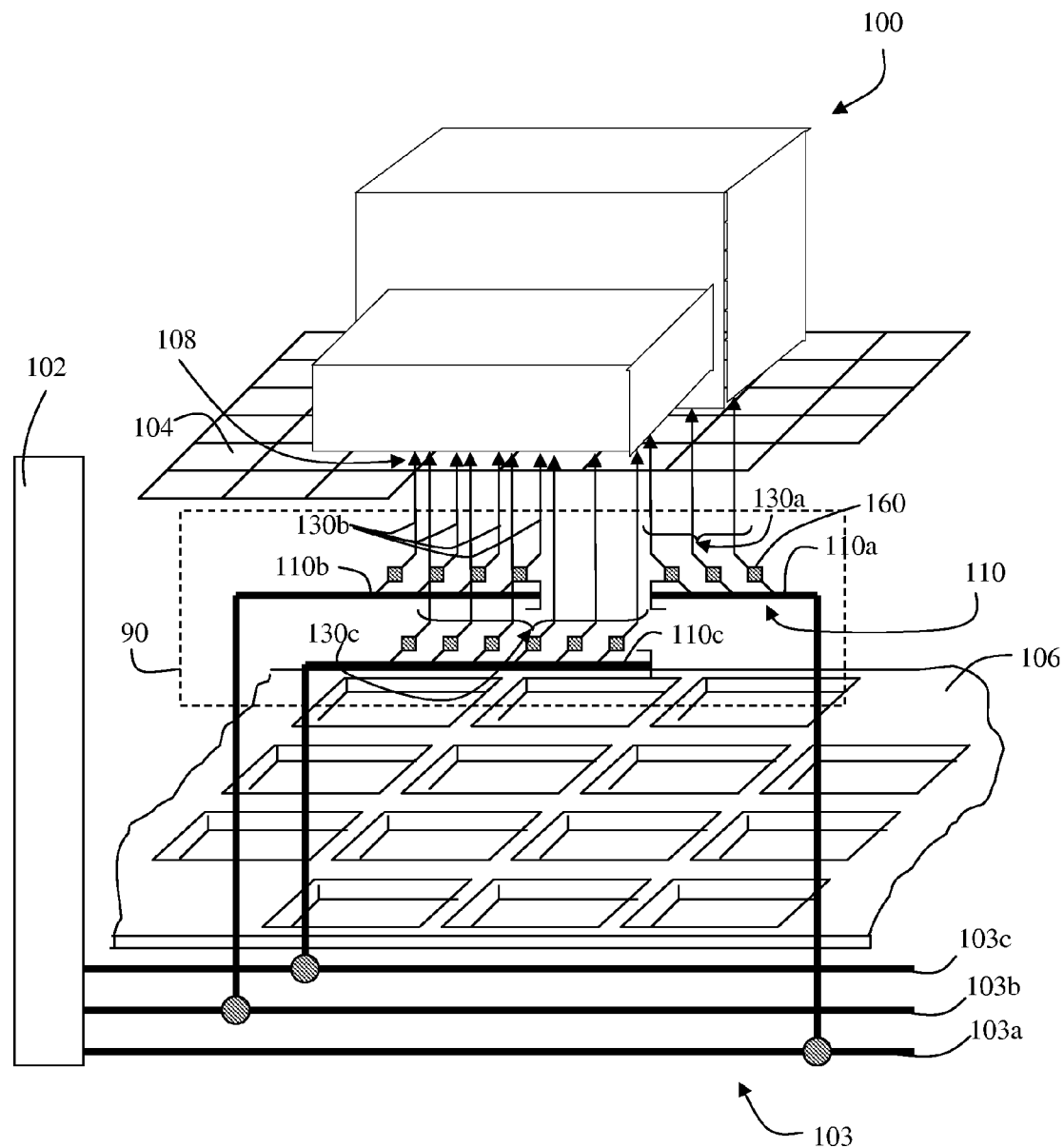
FIG. 1 is a schematic diagram of a semiconductor manufacturing process tool with modular exhaust gas headers.

FIG. 1 shows one embodiment of a modular exhaust gas header 90 designed for use with a process machine 100 used in a manufacturing facility, e.g., a semiconductor fab, solar panel manufacturing fab or a pharmaceutical manufacturing plant, having an exhaust gas handling system 102. More particularly, header 90 is connected between process machine 100 and exhaust gas main duct 103, which in turn is connected to exhaust gas handling system 102. Typically, although not necessarily, headers 90 are built off-site from the manufacturing facility in which they will ultimately be installed.

In a typical application, process machine 100 is positioned on process-level floor 104. In some manufacturing facilities, floor 104 is affixed to and supported by a process tool pedestal frame (not shown) which would have pedestal support legs (not shown) that extend down to base mount locations (not shown) on a waffle-grid floor 106. Modular exhaust gas header 90 may be located in removable floor panels in process-level floor 104 (typically, under or adjacent process machine 100), in the space between the process-level floor and waffle-grid floor 106, beneath the waffle-grid floor, or above the process tool as determined by the process tool facilities requirements, or elsewhere.

Process machine 100 has exhaust gas points of connections 108 (also referred to as "POCs" 108) for removal of gases either used or generated by the process performed by the process machine. The number and type of exhaust gas connections 108 depends upon the nature of process machine 100, as well as its design and manufacture. Semiconductor manufacturing, for example, may utilize a wide variety of process machines 100 having POCs 108, such as lithographic coaters/developers/exposure systems, thermal processors, plasma or dry etch machines, surface preparation systems, chemical vapor deposition machines, physical vapor deposition, diffusion, wet chemical benches or single substrate wet chemical systems, and others well known to those skilled in the art. While modular exhaust gas header 90 may be used in connection with process machines 100 used in the semiconductor manufacturing industry, it may also be used in a variety of other industries including, without limitation, any substrate or roll-to-roll processing environments where exhaust process gases are segregated into specific types. These could be solar (photovoltaic or PV), MEMS (Micro Electro Mechanical Systems), biomedical, or other manufacturing environments where individual or batch processing of substrates occurs.

Exhaust gas points of connections 108 are often grouped by the type of exhaust gases they emit to facilitate connection to main ducts 103. For example, POCs 108a may emit caustic and/or corrosive exhaust gases, POCs 108b may emit volatile organic compounds or solvents (VOCs), and POCs 108c may emit high-temperature exhaust gases. Accordingly, exhaust gas header 90 may be constructed to receive any gases emitted from process machines 100, as discussed more below. These gas may include, without limitation, gases from chemical-mechanical polishing, whether or not vapor-saturated, any vapor or dry gas chemicals, specialty gases, toxic gases, inert gases, particulate exhaust, dust collection exhaust and heat exhaust.

Figure 2:
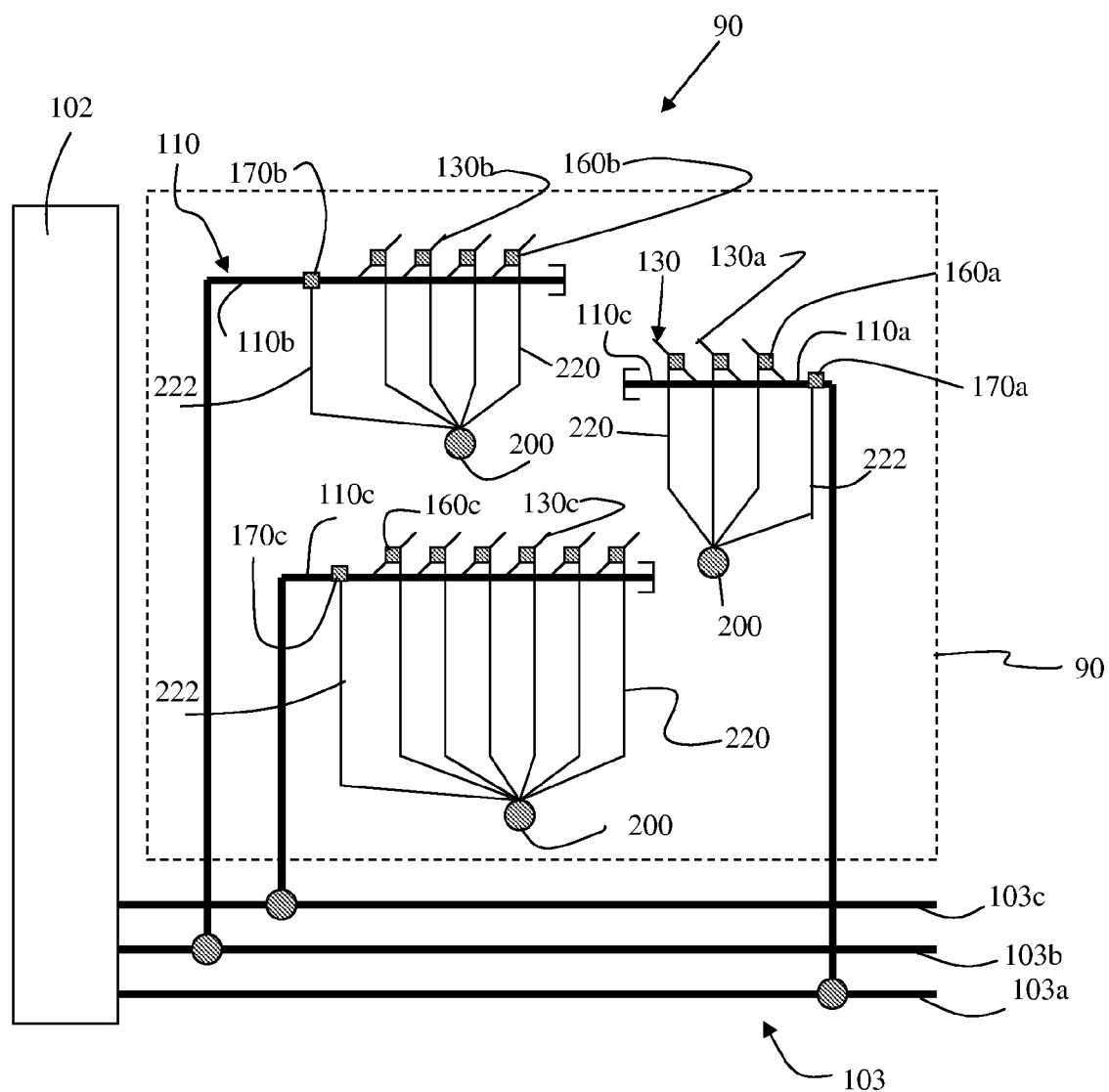
FIG. 2 is a schematic diagram of the modular exhaust gas headers shown in FIG. 1 and proximate piping or ductwork, including impulse lines to pressure instrumentation.
Figure 3:
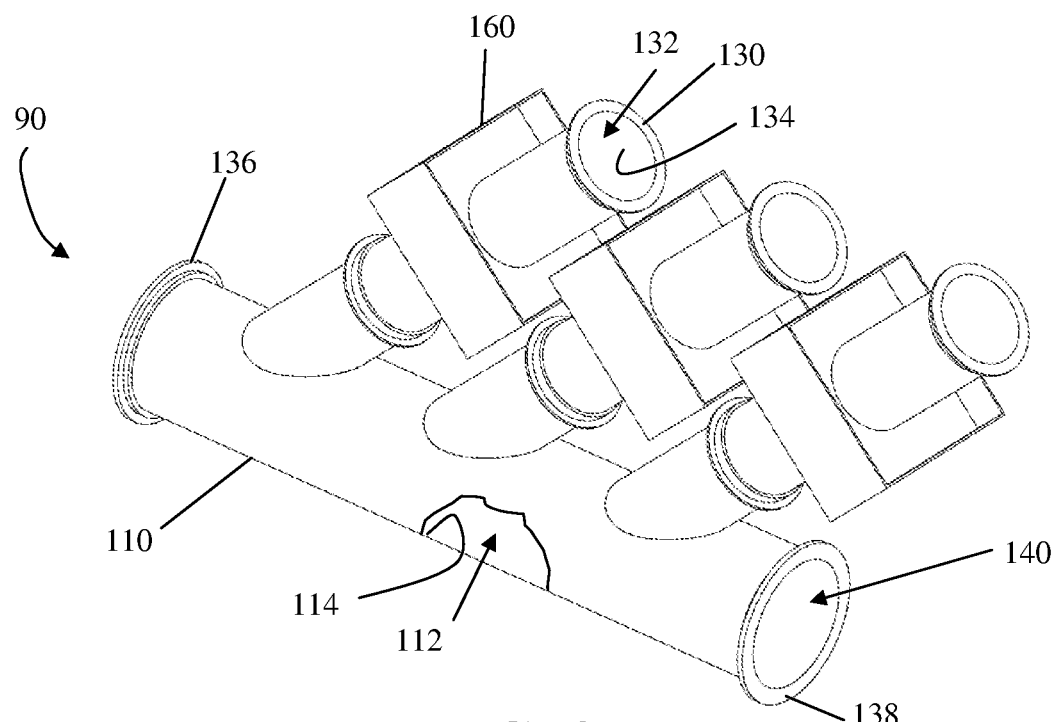
FIG. 3 is a perspective view of a three-branch modular exhaust gas header.
Figure 4:
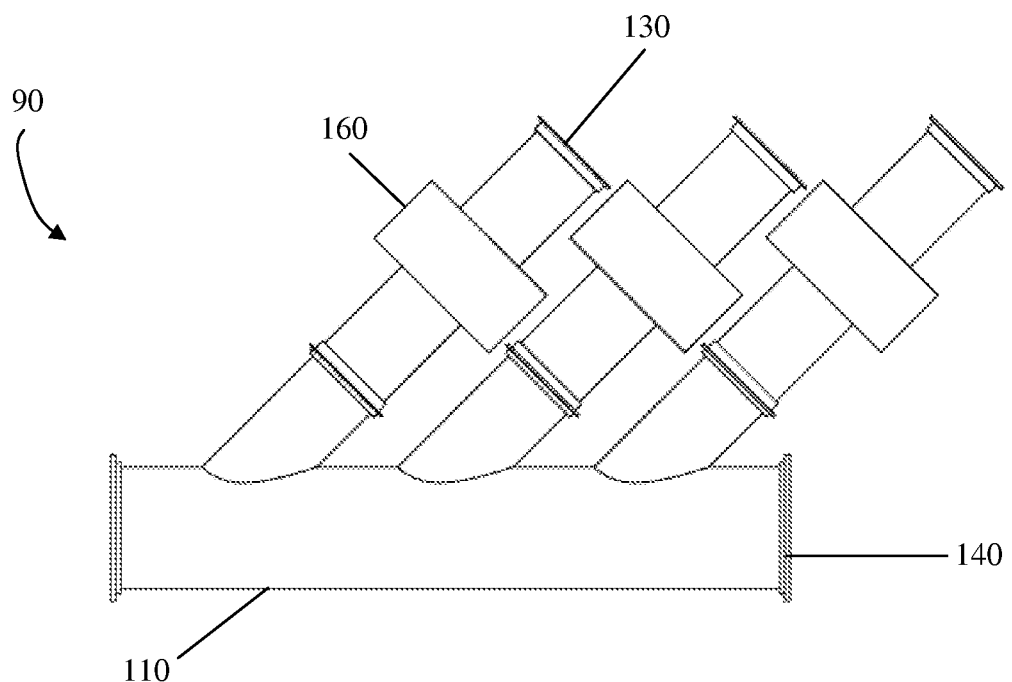
FIG. 4 is a side elevation view of the modular exhaust gas header of FIG. 3.

Referring now to FIGS. 1-4, modular exhaust gas header 90 includes one or more primary exhaust ducts 110, e.g., ducts 110a, 110b and 110c. In this regard, the modular exhaust gas header 90 shown in FIGS. 1 and 2 includes three ducts 110, whereas header 90 illustrated in FIGS. 3 and 4 includes a single duct 110. Ducts 110 may have a circular, oval, square or other cross-sectional configuration. Primary exhaust ducts 110 have an interior 112 defined by inner wall 114 (see FIG. 3). Ducts 110 include an end 136 for attachment to exhaust gas main duct 103 and an opposite end 138 that may be sealed with a cap 140. In some cases, primary exhaust ducts 110 are connected directly to main duct 103, and in other cases the primary exhaust ducts 110 are connected via additional ductwork (not labeled in the drawings) to the main piping. In FIGS. 1 and 2, the dotted boxes which identify header 90 schematically in FIGS. 1 and 2 also include some of this additional ductwork. It is to be appreciated that such additional ductwork is not typically considered part of header 90.

Modular exhaust gas header 90 includes a plurality of exhaust gas branch ducts 130 for fluidly connecting primary exhaust ducts 110 with exhaust gas points of connection 108. Each branch duct 130 includes a hollow interior 132 defined by inner wall 134. Branch ducts 130 may have a circular, oval, square or other cross-sectional configuration. The number and placement of branch ducts 130 is selected so that each branch duct is positioned for attachment to a corresponding POC 108 on process machine 100, as discussed more below. In some cases, branch ducts 130 are attached directly to POCs 108, and in other cases ductwork (not labeled in the drawings) is provided connecting the branch ducts 130 with the POCs. Again, it is to be appreciated that such additional ductwork is not typically considered part of header 90 even though it is included in the dotted boxes identifying header 90 in FIGS. 1 and 2.

In certain applications, it will be desirable to connect branch ducts 130 to a corresponding primary duct 110 through a flow control device (e.g., static or dynamic with active proportional-integral-derivative (PID) control) 160 for adjusting the flow of exhaust gas in the branch duct with which the flow control device is associated. Flow control device 160 may be a blast gate, a butterfly valve, knife gate or other variable flow control device. Also, in certain applications, it will be desirable to fluidly connect primary ducts 110 to exhaust gas main duct 103 through a flow control device 170 (FIG. 2). Balancing the exhaust gas pressure at each branch duct 130 connected to a given primary duct 110 and/or at each primary duct 110, allows for the more uniform removal of exhaust gases from a particular process machine 100 or across a group of such machines. This balancing across a group of machines allows overall matching of process performance for like process machines 100 within an overall processing system, which in turn can maximize system throughput. Where multiple process machines 100 share an exhaust gas main duct 103, flow balancing between the process machines may be achieved using flow control device 170, alone or with flow control devices 160. The angle and spacing of the connection between primary duct 110 and each branch duct 130 may be selected to maximize the compactness of the design, in cases where compact design is important, while accommodating flow control devices 160.

Discussing further the number and placement of primary ducts 110 and branch ducts 130, modular exhaust gas headers 90 may be constructed for use with specific models of process machines 100 to insure the number and placement of branch ducts 130 corresponds to the number and location of POCs 108 in process machine 100. For example, a modular exhaust gas header 90 may built for use with a coater/developer or in a wafer lithography process. The coater/developer has a number of different exhaust gas points of connections 108. At least three different exhaust types exist in this equipment As discussed above, a branch duct 130 is typically provided for each POC 108 in the coater/developer machine example. Also, the orientation of branch ducts 130 with respect to primary duct 110 to which they are connected may be chosen based on the construction of the process machine 100 to which modular exhaust gas header 90 will be attached, to achieve a compact design, producing the least effort and lowest cost for process system installation, setup, maintenance, and troubleshooting. Other types of process machines 100 may have acid or other types of exhaust requirements that may be common among individual process modules, such as post vacuum pumping systems, which are shared before exhausting to main ducts 103 and may have further processing such as scrubbing of volatile organic compounds (VOC's) prior to connection to exhaust gas handling system 102 inside or outside the process facility before release to the ambient environment.

Some exhaust gases from process tool 100 are corrosive or caustic, and require selection of materials for modular exhaust gas header 90 that are chemically resistant to such exhaust gas. Some gases are predominantly solvent vapors, which also requires the exercise of due care in selecting the materials of construction for header 90. Some gases are exhausted at high temperature and so header 90 also must be designed with that characteristic in mind. Modular exhaust gas header 90 illustrated in FIGS. 1 and 2 is designed to receive exhaust gases which contain solvent or acid corrosives, solvents, and heat or other toxic materials that require handling after emission from process machine 100 and prior to the release into the general atmosphere for safety or general reduction below toxic emission standards. In this regard, for example, primary duct 110a and associated branch ducts 130a may be designed to receive corrosive exhaust gases, primary duct 110b and associated branch ducts 130b may be designed to receive exhaust gases containing volatile solvents and primary duct 110c and associated branch ducts 130c may be designed to receive high-temperature exhaust gases. Other categories of exhaust gases may also be accommodated. The combination of a primary duct 110 and associated branch ducts 130 for receiving exhaust gases of a given type may be conveniently referred to as a header unit 148 (FIG. 5) within header 90. Modular exhaust gas headers 90 may be made from, and/or lined with, any material that is chemically compatible with the chemicals in the exhaust gases, and which can withstand the temperatures and pressures generated by process machine 100. Examples may include rigid stainless steel duct, flexible PVC, flexible stainless steel tubing, or coated ductwork. In some cases, it may be desirable to line the hollow interior portions of headers 90 with materials that are resistant to the exhaust gases being transported. For example, inner wall 114 of primary duct 110 and inner wall 134 of branch duct 130 may be lined with a material that is resistant to exhaust gases that will be transported through such ducts. Also, any ancillary duct used to connect header 90 with process machine 100 and main duct 103 should be made from and/or lined with a material that is resistant to the exhaust gases being transported.

Continuing with the example involving the use of the coater/developer machines discussed above, heat exhaust common to a number of sub-process baking or other heat producing modules may be emitted from several POCs 108 on the coater/developer machines. Caustic or solvent exhaust for HMDS (Hexamethyl DiSilazane) modules, as well as photo-sensitive long chain carbon containing resist (PR) application spin modules and PR spin cup modules, may also be emitted from POCs 108 in the coater/developer machines. Exhaust from each of the POCs 108 associated with these modules can require a specific type of primary duct 110 and branch duct 130 for the purpose of transporting the exhaust for downstream for decontamination or scrubbing of the exhaust gas before or after exhaust gas handling system 102, as desired by the facility designer or operator.

Figure 5:
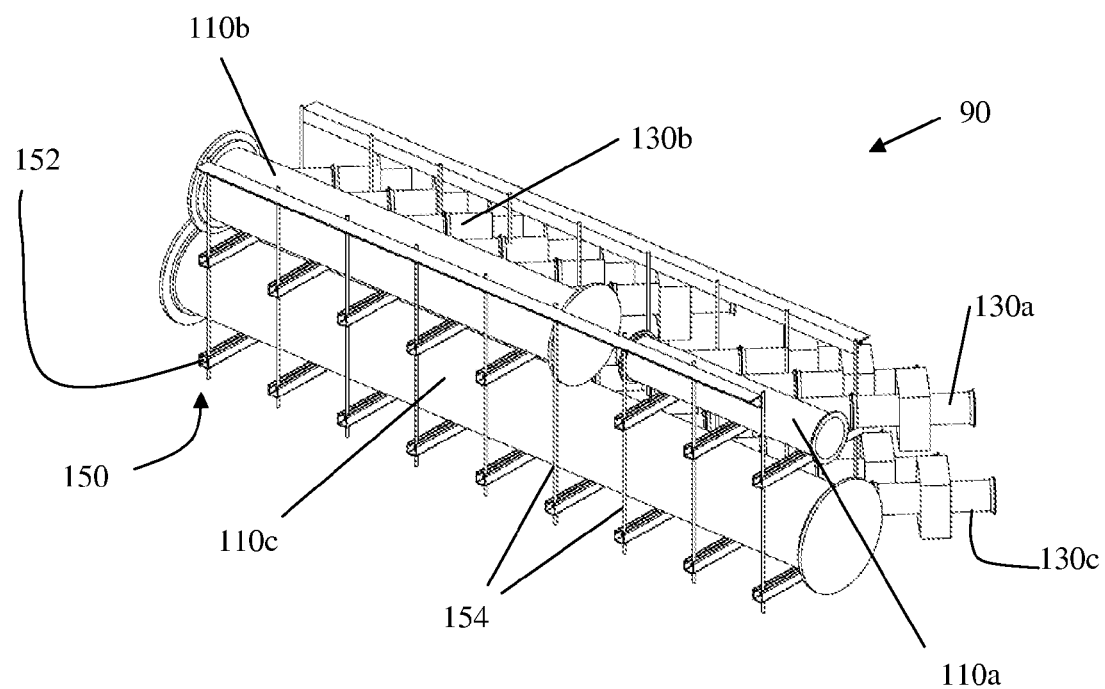
FIG. 5 is a perspective view of a modular exhaust gas header having three primary ducts connected together.

Referring now to FIGS. 1-5, and particularly FIG. 5, when modular exhaust gas header 90 includes more than one primary duct 110 and associated branch ducts 130, as is typically the case when more than one type of exhaust gas is to be received from process machine 100, a separate header may be used for each type of exhaust gas, or a unitary header may be used to receive all of the exhaust gas types emitted from the process machine or multiple like machines having common exhaust requirements. The former is illustrated in FIG. 5. To achieve such a unitary assembly, primary ducts 110a, 110b and 110c are, in one example, attached together by a plurality of support members 150 (FIG. 5) attached to the primary ducts via welding, fasteners or other attachment techniques. Support members 150 may, in one implementation, be tied together via a collection of supports 152 and stringers 154. Support members 150 may be used to support a header 90 having any number of primary ducts 110, i.e., 1–N primary ducts.

Figure 6:
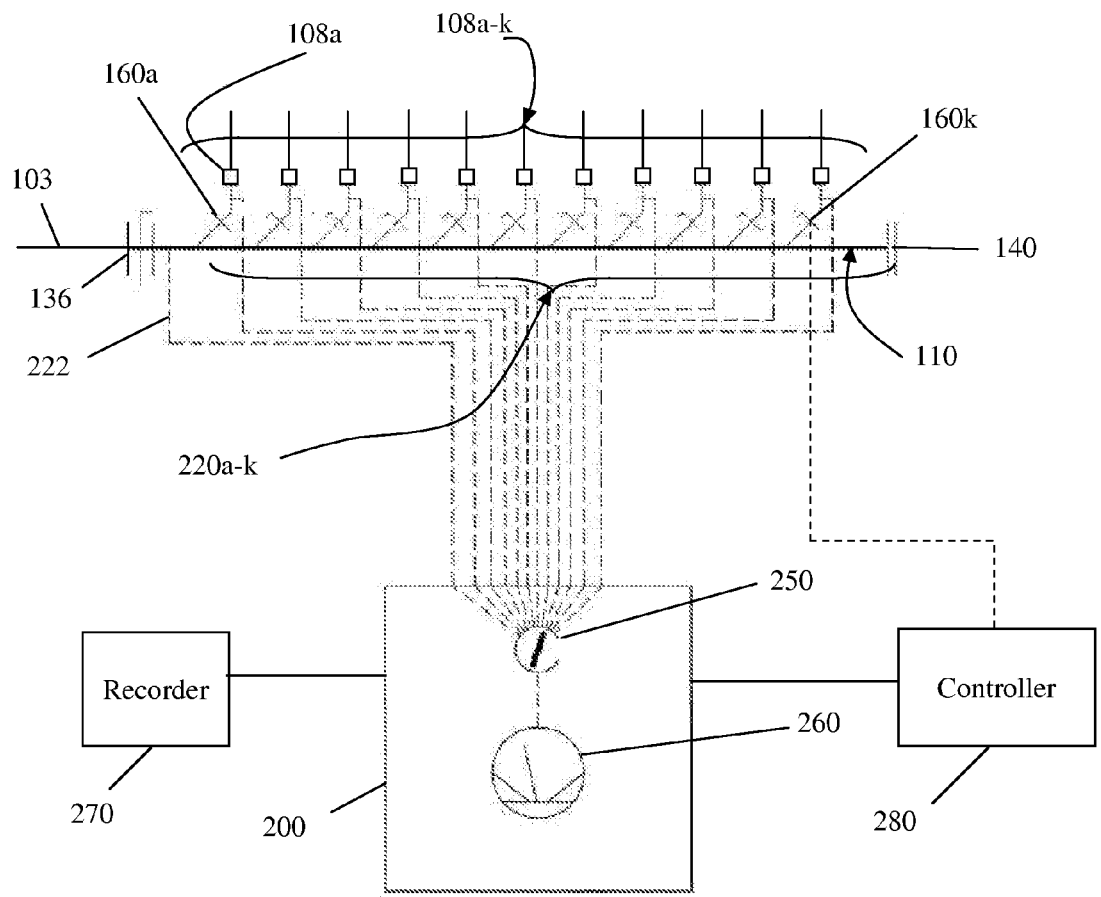
FIG. 6 is a schematic diagram of a eleven-branch modular exhaust gas header showing impulse lines with multi-port switch and a pressure monitoring device.

Turning now to FIGS. 1, 2 and 6, optionally, exhaust gas header 90 may include a monitoring device 200 for use in monitoring and balancing pressure and/or exhaust gas flow among some or all of primary ducts 110 and branch ducts 130 when the latter are attached to corresponding POCs 108 on process machine 100. When monitoring device 200 is employed, a plurality of branch impulse lines 220 and primary impulse line 222 are provided. Branch impulse lines 220 fluidly connect branch ducts 130 with monitoring device 200 and primary impulse lines 222 fluidly connect primary ducts 110 with the monitoring device. Impulse lines 220 are connected to branch ducts 130 between the flow control device 160 for the branch duct and POC 108 to which the branch duct is connected. Impulse lines 222 are fluidly connected to primary ducts 110 at any convenient location along the length of the primary ducts. Impulse lines 220 and 222 are not typically considered as part of header 90, even though they are illustrated in FIG. 2 within the dotted box that schematically identifies the header.

Monitoring device 200 may include a multi-port switching valve 250 and a pressure gauge 260, e.g., a differential pressure gauge, for measuring and displaying pressure. Valve 250 fluidly connects a selected one of the primary ducts 110 and branch ducts 130 with pressure gauge 260. When so connected, pressure gauge detects and displays the pressure in the primary duct 110 or branch duct 130 selected. Information provided by monitoring device 200 can assist in balancing multiple modular exhaust headers 90 throughout the manufacturing facility that share the same exhaust gas main duct 103. More particularly, exhaust gas pressure information provided by monitoring device 200 may be used in adjusting flow control devices 160 and 170 so as to optimize exhaust gas extraction from process machine 100. In some cases it may be desirable to attach a recording device 270 to monitoring device 200 to record changes in pressure over time in primary ducts 110 and branch ducts 130.

System 100 may optionally include a controller 280, e.g., a PID controller, that is connected to monitoring device 200 and to flow control devices 160 and/or 170. When controller 280 is provided, flow control devices 160 and 170 operate as a function of control information provided by the controller. In this regard, flow control devices 160 and 170 include may include a motor drive or other actuator (not shown) that causes the flow control devices to open or close as a function of such control information so as to increase or decrease the flow of exhaust gases passing through the flow control devices. In FIG. 6, for convenience of illustration, controller 280 is shown connected to a single flow control device 160, although it is to be appreciated that the controller is generally connected to all of the flow control devices for a header 90. Control information provided by controller 280 to the motor drives associated with flow control devices 160 and 170 may be generated by comparing pressure information provided by monitoring device 200 with predetermined setpoints. The control information provided by controller 280 may be developed as a function of the deviation of such pressure measurements from the setpoints.

Use of modular exhaust gas headers 90 in designing an installation of process machines 100 in a manufacturing facility can expedite and simplify installation of such process tools. Many process machines 100, e.g., process machines used in semiconductor manufacturing, represent a large investment in time and capital, so that efficiently bringing the production tools on line and qualifying the products they produce is critical to obtaining a satisfactory return on investment.

Significant manpower resources are often consumed in providing connections between a manufacturing process machine 100 and exhaust gas handling system 102. Custom fabrication of piping or ductwork for hookup of process machine 100, the standard approach to date, can be time-consuming, and if delayed until tool delivery in order to avoid rework, can coincide with other installation project tasks and create bottlenecks in project completion. In addition, fabrication of piping or ductwork hookups within the manufacturing facility's clean room can create contamination issues. Headers 90, by contrast are designed ahead of time, without respect to a given installation of process machines 100. As discussed more below, while headers 90 are designed with respect to a given process machine 100, they are not typically designed with respect to the manufacturing facility in which they will ultimately be used.

Figure 7:
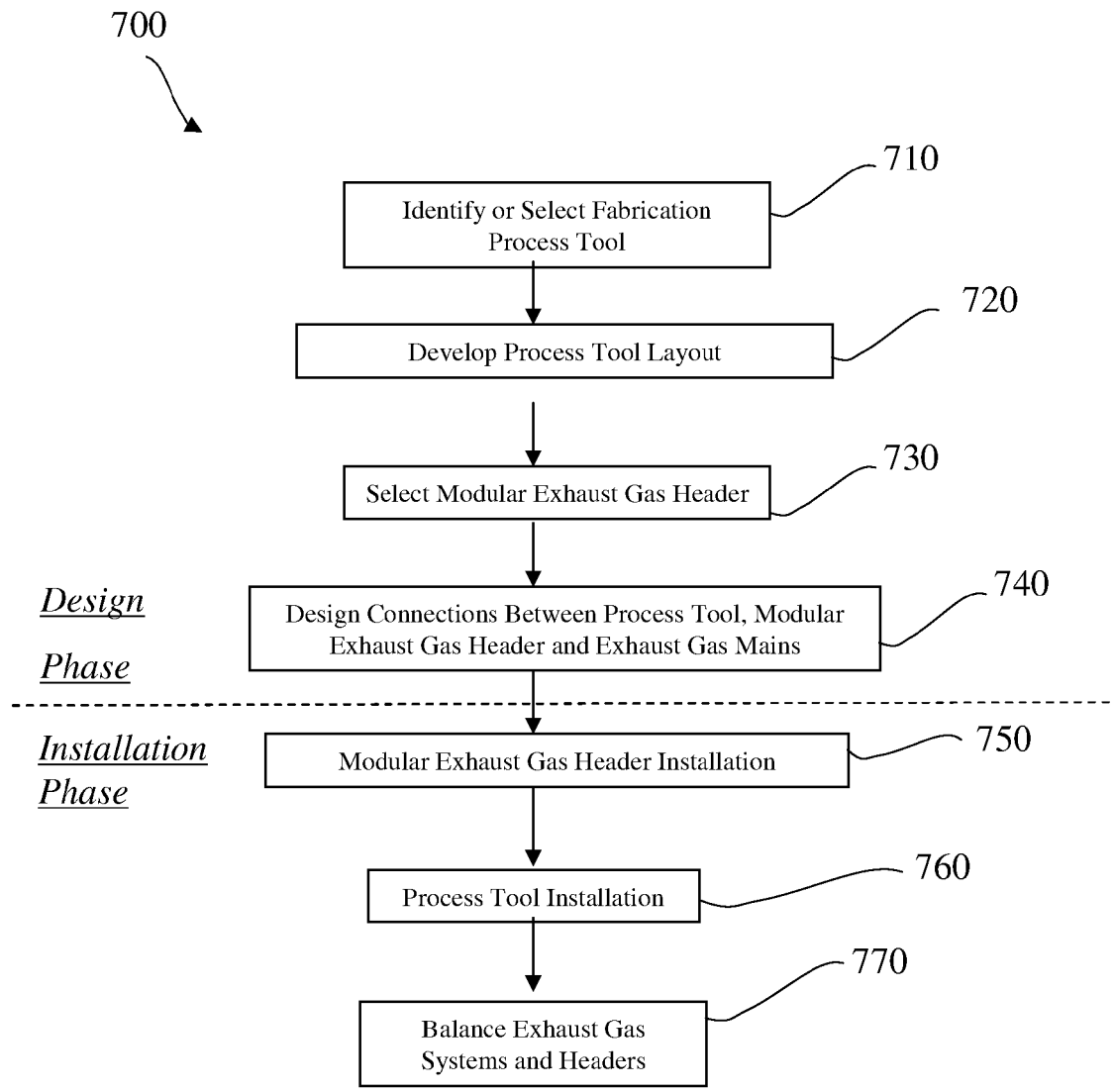
FIG. 7 is a flow chart of a design process utilizing modular exhaust gas headers.

FIG. 7 illustrates a method 700 of designing an installation of process machines 100 in a manufacturing facility incorporating modular exhaust gas headers 90 in accordance with the various embodiments of the invention, and subsequently installing the process tools and headers. The method contemplates that previously designed headers 90 exist, or are developed before the design process described below, for each process machine 100 to be installed. In some cases, a header 90 may be designed for use with more than one process machine 100, with unused branch ducts 130 being capped when the header is used with process tools having fewer POCs 108 than branch ducts. Headers 90 are not typically designed with respect to the manufacturing facility in which they will be installed. For example, headers 90 are not generally designed with respect to the location and configuration of exhaust gas handling systems 102 and exhaust gas main duct 103 in the manufacturing facility in which the headers are ultimately installed. Nor are headers 90 typically designed in light of the physical relationship of the headers to the process machine 100 with which they will ultimately be connected.

Modular exhaust gas headers 90 are typically designed and built outside the portion of manufacturing facility where the process tools will be installed, typically in a plant remote from the manufacturing facility. Frequently, although not necessarily, headers 90 are built in a clean room environment. In some cases, it may be desirable to build the exhaust gas headers 90 on site, i.e., in the clean room. Certain manufacturers may find it desirable to list a variety of headers 90 in their product catalog, each for one or more process tools 100.

In designing a header 90, the exact make and model of the process machine 100 with which the header is designed to be used is first determined, which in turn reveals the number and placement of exhaust gas points of connection 108 of the process tool, and the type of exhaust gases emitted, e.g., caustic or high-temperature. Chemical and temperature compatibility between exhaust gases emitted from POCs 108 and the various branch ducts 130 and primary ducts 110 receiving the exhaust is determined, and appropriate materials and/or linings are selected for the ducts.

Turning now to FIGS. 1 and 7, as the first step in the method, step 710, the designer selects the process tools 100 to be used in the tool installation. At step 720, the designer selects the layout and specific placement of process tools 100 relative to one another and with respect to features of the manufacturing facility in which the tools are installed, e.g., walls, support structures, and exhaust gas main duct 103.

During step 720, space is allocated for all modular exhaust gas headers 90, typically in process-level floor 104, between the process-level floor and waffle-grid floor 106, and close to the planned location of process tools 100 with which the corresponding headers will be used. Layout may also include allowances for access to inspect and maintain the piping or ductwork, or service associated instrumentation.

Next, at step 730, which actually is a part of the overall process of laying out process tools 100, a modular exhaust gas header 90 is selected. As discussed above, headers 90 are pre-designed, and sometimes pre-built, typically away from the portion of manufacturing facility in which they will be installed, and are designed for use with a specific process machine 100. Taking into account the known size and configuration of the header 90 intended for use with a selected process machine 100, the precise location of the process tool is determined. As discussed more below in connection with the discussion of the installation of headers 90 and process tools 100, when the headers are manufactured off-site, as will often be the case, connection of the process tools to exhaust gas main duct 103 is greatly expedited and simplified.

As the final step of the design process, step 740, piping or ductwork connections between primary ducts 110 and exhaust gas main duct 103, if required, and between branch ducts 130 and POCs 108, if required, are designed. Of course, specifications for such ancillary piping or ductwork connections should take into account the nature of the exhaust gases being transported. Devices for mechanically securing headers 90 to support structures in the manufacturing facility in a desired position are also designed and may include view tiles or other integrated elements to the process-level floor 104 or waffle slab 106 or other suitable wall or ceiling structure depending on facility design and layout.

The design process described above differs markedly from known processes for designing the layout of process tools 100. In known processes, connections between process tools 100 and main duct 103, and in turn to exhaust gas handling system 102, are not included in the layout design. Rather, after process tools 100 are installed, contractors enter the manufacturing facility, measure the spacing between the process tools and main duct 103, and develop custom-built exhaust gas headers. This known approach to connecting process tools 100 with exhaust gas handling system 102 creates congestion in the manufacturing facility, slows installation of the process tools, typically is more expensive than the use of headers 90, and can introduce more contaminants into the manufacturing environment than occurs with the installation and use of headers 90. In operation, uniformity of installation of like tools reduces the risks of asymmetric performance as experienced under the known installation method, and achieving identical performance from like tools is simpler and more straightforward with a modular installation. Frequent rebalancing of total exhaust in any facility occurs when additional tools are brought online thereby causing processing down time for already installed and balanced tools. The use of modular exhaust systems enables quick matching of systems and easy rebalancing of already installed systems. Having identical test points, readouts of existing settings for each test point and the ability to match setpoints between like tools POCs enables quick balancing and rebalancing of the installation settings. Troubleshooting any branch when a process is out of control (i.e. deviates from setpoint beyond predetermined limits) and an exhaust setting is questioned is as easy as monitoring earlier settings versus the current readout of any POC and any like POC for balancing purposes. The present method of designing an installation of process tools 100 goes against conventional wisdom and practices. If, however, designers and executives responsible for making decisions concerning approaches for installing process tools 100 can break from well-established thinking, connection of the process tools to exhaust gas handling systems 102 can be expedited, simplified and often performed at reduced cost.

Following completion of the design process discussed above, process tools 100 are installed. Referring to step 750, often, the manufacture, installation and connection of modular exhaust gas headers 90 to the facility exhaust gas handling system 102 can be scheduled ahead of the delivery of process tools 100. In some cases, however, it may be desirable to install process tools 100 first. After installation of modular exhaust gas headers 90, checkout and cleaning can be performed. Ideally, the design process can incorporate these stages of the capital project into the construction schedule. Next, at step 760, once process tools 100 have been delivered and set and affixed to the process tool pedestal frame or other support structures, points of connection 108 of process tools 100 are attached to branch ducts 130 of header 90. In some cases, POCs 108 are attached directly to branch ducts 130, and more often, intermediate runs of duct (not shown) are used.

Referring to FIGS. 1, 6 and 7, at step 770, flow control devices 160 in each branch duct 130, and flow control devices 170 in each primary duct 110, can be adjusted to balance exhaust gas flow prior to startup of process tools 100, based upon data collected by monitoring device 200 or through the use of portable pressure measurement tools (not shown). This adjustment may be accomplished by operating multi-port switching valve 250 so that the pressure in each branch duct 130 and/or primary duct 110 may be sequentially or simultaneously viewed on pressure gauge 260, depending on the construction of the gauge used. By recording exhaust gas pressure differences between branch ducts 130 and/or between primary ducts 110, control devices 160 and 170 may be appropriately manually or automatically adjusted so as to achieve optimal removal of exhaust gases.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A modular exhaust gas header for a processing machine, comprising:
    at least one primary exhaust gas duct having a hollow interior for transporting exhaust gases;
    a plurality of branch ducts having hollow interiors, each connected to said at least one primary exhaust gas ducts so as to fluidly connect said interior of said at least one primary exhaust gas duct with said interiors of said plurality of branch ducts, and each of said plurality of branch ducts being configured to attach to the processing machine;
    a pressure sensor for measuring pressure in a selected one of said plurality of branch ducts; and
    a plurality of impulse tubes fluidly coupling said interiors of said plurality of branch ducts with said pressure sensor, each of said plurality of branch ducts having at least one impulse tube coupled with said sensor wherein said pressure sensor includes a pressure measurement device and a multi-position valve fluidly connected to said pressure measurement device and to each of said plurality of impulse tubes, said multi-position valve permitting selection of one of said plurality of branch ducts for pressure measurement by said pressure measurement device.

2. A modular exhaust gas header according to claim 1, wherein said plurality of branch ducts and said at least one primary duct are resistant to exhaust gases having at least one of caustic, solvent and high-temperature constituents.

3. A modular exhaust gas header according to claim 1, wherein said at least one primary duct includes a plurality of primary ducts, further wherein each of said plurality of primary ducts is connected to at least two of said plurality of branch ducts so as to form a header unit thereby enabling fluid coupling between each of the plurality of primary ducts and the processing machine, wherein each header unit can transport one or more of high-temperature gases, corrosive gases and gases with volatile solvents.

4. A modular exhaust gas header for a manufacturing process tool according to claim 1, further comprising a plurality of first flow control devices and at least a second flow control device, wherein at least one of said first flow control devices is connected to each of said plurality of branch ducts and adjustably controls exhaust gas flow through said branch duct, and wherein said second flow control device is connected to said at least one primary exhaust gas duct and adjustably controls exhaust gas flow through said at least one primary exhaust gas duct.

5. A modular exhaust gas header according to claim 4, wherein said plurality of flow control devices include butterfly valves.

6. A modular exhaust gas header according to claim 4, wherein said plurality of flow control devices include blast gates.

7. A modular exhaust header according to claim 4, wherein said plurality of flow control devices open and close as a function of control information provided thereto, the header further including a controller for providing said control information to said plurality of flow control devices.

8. A modular exhaust gas header for a processing machine, comprising:
- at least one primary exhaust gas duct having a hollow interior for transporting exhaust gases;
- a plurality of branch ducts having hollow interiors, each connected to said at least one primary exhaust gas duct so as to fluidly connect said interior of said at least one primary exhaust gas duct with said interiors of said plurality of branch ducts, and each of said plurality of branch ducts being configured to attach to the processing machine;
- a pressure sensor for measuring pressure in a selected one of said plurality of branch ducts; and;
- a plurality of impulse tubes fluidly coupling said interiors of said plurality of branch ducts with said pressure sensor;
- wherein said pressure sensor includes a pressure measurement device and a multi-position valve fluidly connected to said pressure measurement device and to each of said plurality of impulse tubes, said multi-position valve permitting selection of one of said plurality of branch ducts for pressure measurement by said pressure measurement device.

9. A modular exhaust gas header according to claim 8, wherein said at least one primary duct includes a plurality of primary ducts, further wherein each of said plurality of primary ducts is connected to at least two of said plurality of branch ducts so as to form a header unit thereby enabling fluid coupling between each of the plurality of primary ducts and the processing machine, wherein each header unit can transport one or more of high-temperature gases, corrosive gases and gases with volatile solvents.

* * * * *